Nov. 30, 1965 D. A. McLEAN ETAL 3,220,938

OXIDE UNDERLAY FOR PRINTED CIRCUIT COMPONENTS

Filed March 9, 1961 2 Sheets-Sheet 1

INVENTORS D. A. McLEAN
D. S. NICODEMUS
BY
George S. Indig
ATTORNEY

OXIDE UNDERLAY FOR PRINTED CIRCUIT COMPONENTS

Filed March 9, 1961 2 Sheets-Sheet 2

INVENTORS D. A. McLEAN
D. S. NICODEMUS
BY George S. Indig
ATTORNEY

United States Patent Office 3,220,938 Patented Nov. 30, 1965

3,220,938

OXIDE UNDERLAY FOR PRINTED CIRCUIT COMPONENTS

David A. McLean, Chatham, and Doris S. Nicodemus, Cedar Knolls, N.J., assignors to Bell Telephone Laboratories, Incorporated, New York, N.Y., a corporation of New York Filed Mar. 9, 1961, Ser. No. 94,543
1 Claim. (Cl. 204—15)

This invention relates to a method for producing a thin pattern of a film forming metal on a substrate, and is particularly well suited for use in the fabrication of printed circuit components, such as resistors and capacitors.

There are many applications in the field of industry which require the production of metallic designs or patterns on various substrates. Thus, for example, in the fabrication of semiconductive devices, it is sometimes necessary to produce metallic electrode patterns on the surfaces thereof. Another instance requires the use of metallic designs or patterns for the fabrication of printed circuit capacitors in accordance with the method described in copending application Serial No. 742,068 filed June 16, 1958, now Patent No. 2,993,266, by R. W. Berry.

The simplest methods of producing metallic patterns or configurations upon substrate materials involve the use of a mask in conjunction with vacuum evaporating or sputtering techniques (see "Vacuum Deposition of Thin Films," L. Holland, J. Wiley & Sons, 1956). The fact that these methods involve the fabrication of a mask with openings corresponding to the configuration of the desired metal pattern is a distinct disadvantage when the metallic patterns to be produced are either extremely minute in size or are intricate in detail. The masks necessary to produce such patterns tend to be fragile and exceedingly difficult to handle. For these reasons, photoengraving techniques are generally preferred for the production of intricate or highly detailed metallic patterns on a substrate.

Exemplary of the use of photoengraving to produce fine detail patterns is the production of artistic creations or printed matter on copper or zinc plates for printing or engraving purposes.

The conventional photoengraving process consists of the steps of coating the metal to be engraved with a light sensitive photo-resist, exposing certain portions of the resist to light, developing the resist so that those portions upon which the light impinged are stabilized, dissolving the unexposed resist, and contacting with a selective etchant which attacks and erodes the exposed metal and leaves the resist pattern and underlying metal untouched. The result of such processing is the production of a pattern in the metal surface which corresponds with the pattern of light employed in exposing the resist. Conventional photo-resists (see, for example, U.S. Patents 2,670,285, 2,670,286, 2,670,287) are suitably employed in such processes.

The utilization of photoengraving techniques to produce precision patterns on certain unusually inert film forming metals, such as tantalum, and niobium, has met with some difficulty. The problem arises from the nature of the materials conventionally utilized for etching the film forming metal. These materials may have a variety of compositions, but they regularly contain hydrofluoric acid or fluorides as the active etching ingredient. Employment of such etchants may result in an undesirable undercutting of the film forming metal due to the attack of hydrofluoric acid and fluorides on the substrate, after the metal is etched through. Usually, the glass or ceramic substrate which is used etches at a faster rate than the metallic layer, so causing the formation of deep trenches between circuit elements. Since the metal is not dissolved uniformly, the contour of this trench contains numerous pits and is jagged in nature. Subsequent evaporization of films across such a boundary are likely to cause the formation of a weak point in the electrical continuity of the film.

A further shortcoming of present techniques for the fabrication of printed circuit resistors prepared by this method is the lack of reproducibility of resistor values. This may be attributed to the fact that the film forming metal fails to etch evenly over the entire substrate and, as a result, a time lapse occurs between the moment the bare substrate first appears and the time at which all of the film forming metal to be etched is removed. During this hiatus the fluoride etch may attack the substrate under the circuit and, eventually attack the protected layer of metal from the underside, so adversely affecting the resistance values.

The present invention is directed to a novel method for the production of intricate designs and patterns of film forming metals which are not readily attacked by the etchants commonly utilized in conventional photoengraving techniques, but which are most advantageously etched with fluoride etches. By reason of the technique disclosed herein there is produced a printed circuit component or integrated circuit possessing a high degree of precision which does not suffer from the prior are deficiency of undercutting.

In accordance with the present invention, printed circuit components are fabricated by successively depositing a first layer of the oxide of a film forming metal on a suitable substrate, depositing a second layer comprising a film forming metal, and selectively removing portions of the second layer by photoengraving techniques. The application of the oxide film provides the necessary resistance to attack by the fluoride etchants, protects the bare substrate, and, thus, avoids undercutting.

Other advantages and various features of the invention will become apparent by reference to the following description taken in conjunction with the accompanying drawing forming a part thereof and from the appended claim wherein:

Figure 7B:
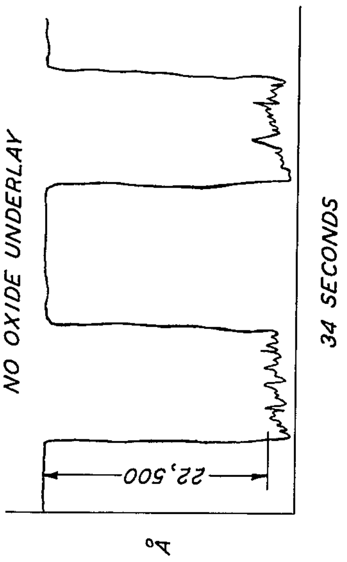
FIG. 7B is a graphical representation of Talysurf measurements of etch depth of the substrate showing the effect of etching a layer of tantalum with no oxide underlay on a glass substrate for 23 seconds.
Figure 7D:
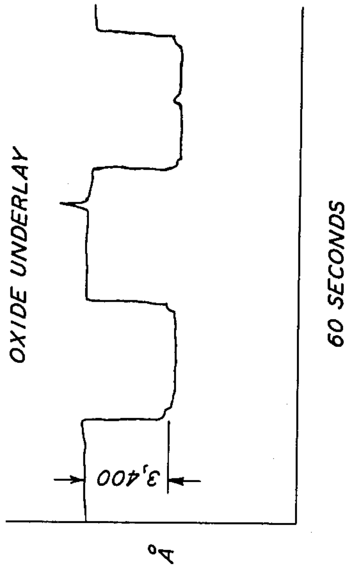
FIG. 7A is a graphical representation of Talysurf measurements of etch depth of the substrate showing the effect of etching a layer of tantalum with no oxide underlay on a glass substrate for 34 seconds.
Figure 7A:
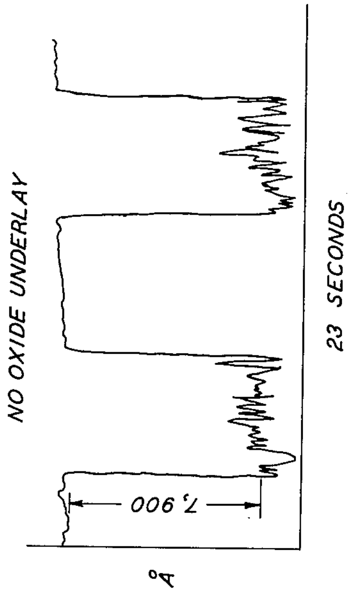
Figure 7C:
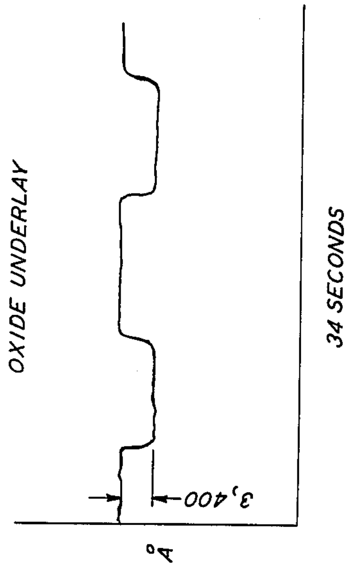

FIG. 7C is a graphical representation of Talysurf measurements of etch depth of the substrate showing the effect of etching a layer of tantalum with a tantalum pentoxide underlay on a glass substrate for 34 seconds; and FIG. 7D is a graphical representation of Talysurf measurements of etch depth of the substrate showing the effect of etching a layer of tantalum with a tantalum pentoxide underlay on a glass substrate for 60 seconds.

Figure 1:
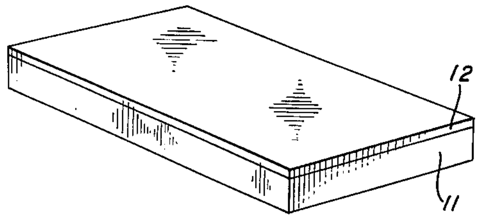
FIG. 1 is a perspective view of a ceramic block upon which a thin metallic layer has been deposited in preparation for oxide formation.

With reference now more particularly to the drawing, FIG. 1 shows a block 11 upon which a metallic pattern is to be produced in accordance with the present invention. The first step in the inventive procedure comprises cleaning block 11 by a series of cleansing techniques. The block is initially treated with trichloroethylene in a standard vapor degreasing procedure. Next, it is cleaned ultrasonically with a detergent comprising a mixture of igepal and water. Then, the material is treated with a mixture of a 10 percent solution of Superoxol and boiling water for several minutes. Following this, the block is boiled three times in distilled or deionized water and, finally dried with a stream of warm nitrogen. Following the cleaning procedure a thin layer 12 of a film forming metal is deposited upon block 11 by cathodic sputtering or vacuum evaporation techniques by conventional methods described by L. Holland, as noted above. Metals such as tantalum, titanium, zirconium, aluminum and niobium are suitable for this purpose. The thickness of the deposited layer is not critical but should be of sufficient magnitude to uniformly cover the surface of the substrate. The initial thickness of the deposited film is preferably of the order of 500 Angstroms but may be less as long as there is assured production of an oxide film of at least 100 Angstroms and the conversion to oxide has been completed. This value has been found to be acceptable for the purposes intended in the present invention. There is no upper limit of initial film thickness dictated by considerations of the inventive process. However, thicker films appear to have no advantages over films 100 Angstroms thick, and considerations of the difference in temperature coefficient of expansion between the substrate and the film dictate a maximum of approximately 2,000 Angstroms.

Figure 2:
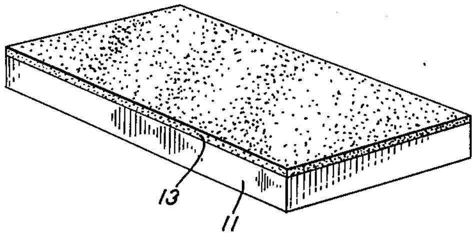
FIG. 2 is a perspective view of the ceramic block of FIG. 1 with the film forming metal transformed to the protective oxide.

The next step in the inventive process consists of oxidizing the layer of film forming metal 12 to form the corresponding oxide film shown in FIG. 2. This result may be achieved by thermally oxidizing the layer of film forming metal 12 by placing block 11 in an oven and heating at a suitable temperature for a time period within the range of 1 to 5 hours. The temperature required varies with the film forming metal, but, for example, is 500° C. for tantalum and is typically in the range of 500 to 700° C. for other film forming metals. The heating is discontinued when film 12 has been oxidized, at least partially, a condition which may be recognized when film 12 becomes transparent. Alternative methods for obtaining the oxide layer 13 include reactive sputtering and electrochemical anodization.

Following the formation of oxide film 13, block 11 is recleaned by treating with a mixture of a 10 percent solution of Superoxol and boiling water, boiling three times in distilled or deionized water, and finally drying in a stream of warm nitrogen.

Figure 3:
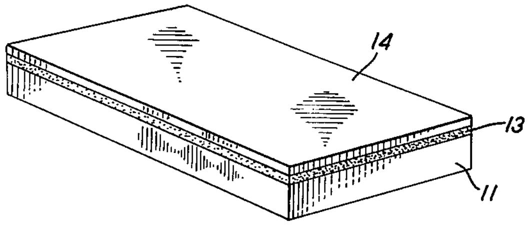
FIG. 3 is a perspective view of the body shown in FIG. 2 after a layer of a film forming metal is deposited upon the oxide layer.

Block 11 containing oxide layer 13 is now ready for the deposition of the second layer. The thickness of this layer depends on the particular circuit desired. The second layer, 14, deposited upon the oxide layer 13, is shown in FIG. 3. Metals such as tantalum, titanium, aluminum, zirconium and niobium are suitable for this purpose. Once again, deposition may be effected by conventional sputtering or vacuum evaporation techniques. The next step in the inventive process consists of photoengraving a pattern in layer 14 so as to completely remove certain portions thereof. Any one of the well known conventional procedures may be used to effect this result, except that the etchant must be suitable for the metal, and for the metals mentioned above will normally contain hydrofluoric acid or other fluorides. (See "The Ferric Chloride Etching of Copper Photoengraving," Schaffert, Winkler, Vaaler and Deubner, 1949, published by Photo-engravers Research, Inc., Columbus, Ohio; and "Photoengraving," Groesbuck, Doubleday, Page and Company, 1924.)

Figure 4:
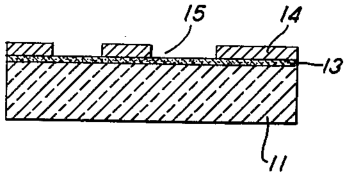
FIG. 4 is a cross-sectional view of the body of FIG. 3 after it has been photoengraved.

Shown in FIG. 4 is block 11 with a desired pattern photoengraved in layer 14. Numeral 15 represents the area from which tantalum was removed by the photoengraving technique.

This completes formation of the pattern, and the various geometric details which have been produced are suitable for resistors and interconnections. Furthermore, when desired, the metal film can be further processed to produce other types of components; for example, capacitors.

Figure 5:
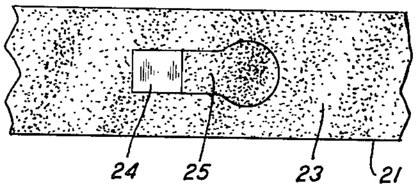
FIGS. 5 and 6 are plan views of a capacitor produced in accordance with the present invention.
Figure 6:
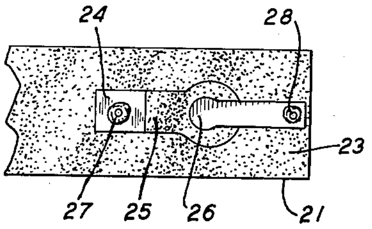

FIGS. 5 and 6 are plan views of a capacitor produced in accordance with the present invention. FIG. 5 shows substrate 21 upon which tantalum pentoxide layer 23 has been deposited in accordance with the procedure described above.

Upon layer 23 there is deposited a thin film of tantalum 24. In accordance with this invention, layer 24 may be produced by a condensation method such as cathodic sputtering or vacuum evaporation techniques. The next step in the fabrication of the capacitor consists of anodizing layer 24 to form an oxide dielectric layer 25 thereover. This procedure is described in detail in copending application Serial No. 742,068.

FIG. 6 is a plan view of tantalum layer 24 coated with anodically formed oxide dielectric layer 25 upon which an electrically conductive metal 26 has been deposited as a counter electrode. This metal may suitably be gold. The final step in the fabrication of the capacitor consists of making electrical connections to the tantalum electrode 24 and gold electrode 26 at points 27 and 28.

As described in the aforementioned copending application, tantalum layer 24 acts as one electrode of the capacitor and gold layer 26 serves as the second or counter electrode of the capacitor. The capacitance of the capacitor so produced is proportional to the area common to both electrodes.

Figure 6A:
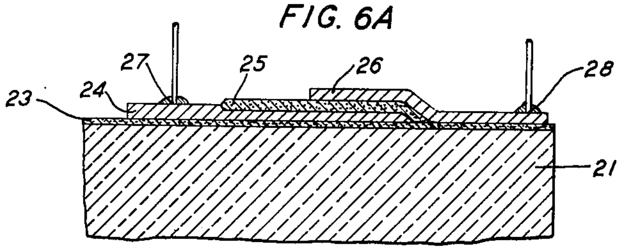
FIG. 6A is a sectional view of the capacitor shown in plan view in FIG. 6.

FIG. 6A is a sectional view of the capacitor which is shown in plan view in FIG. 6. As may be seen from FIG. 6A the original layer of tantalum 24 underlies oxide coating 25. The portion of layer 24 which extends beyond the oxide layer 25 furnishes a means of making electrical connection to this side of the capacitor.

FIGS. 7A through 7D are graphical representations of Talysurf results indicating the degree of etching of a glass substrate having no oxide underlay and one upon which there was an oxide underlay after etching a layer of tantalum with hydrofluoric acid for various time periods. These results were obtained as follows:

Two slides, one with a tantalum pentoxide underlay and one without, were cleaned and sputtered with tantalum in the manner set forth above. A pattern of 10 mil lines and 10 mil spaces was photoresisted, as discussed, onto each sample. Then, by lowering each slide into the etch solution (hydrofluoric acid) at constant speed, a step pattern was obtained over a time period of 70 to 80 seconds. The photoresist was removed and the remaining tantalum strips served as reference levels for a Talysurf measurement. Sample Talysurf recording graphs are shown in the figures (7A through 7D). In FIG. 7A it can be seen that in the absence of an oxide protective layer, the glass has begun to etch considerably after only 23 seconds. After 34 seconds the same slide evidenced an etch depth of three times the prior reading as is seen in FIG. 7B. On the other hand, FIGS. 7C and 7D are the results obtained, respectively, with a protective layer after 34 and 60 seconds of exposure to the etchant, wherein no marked increase in the depth of the trench is noted.

In general, the substrate material is chosen in accordance with the end use of the metal pattern. Thus, for example, in the fabrication of printed circuit components it is recognized that the substrate may be composed of a material which is electrically nonconductive. Ceramic, glass, and in general, heat resistant materials are preferred for this purpose, particularly in view of the fact that deposition of metallic layers by sputtering or vacuum evaporation tends to increase the temperature of the substrate upon which the layer is being deposited.

In the production of printed circuit capacitors in accordance with the present invention, the use of a substrate which is smooth and free from discontinuities is preferred for the reasons advanced in copending application Serial No. 742,068 filed June 16, 1958. Preferred substrate materials for this use include glazed ceramics and all types of glasses.

Although the illustrations described above are directed to the production of printed circuit components, it is to be appreciated that the present technique is suitable for use wherever the desired end result requires a pattern or configuration of a film forming metal on a substrate, and where the etchant employed comprises hydrofluoric acid or a fluoride. Thus, for example, electrode patterns may be produced on the surface of semiconductive devices in accordance with the present invention.

While the invention has been described in detail in the foregoing description and the drawing similarly illustrates the same, the aforesaid is by way of illustration only and is not restrictive in character. The several modifications which will readily suggest themselves to persons skilled in the art are all considered within the broad scope of the invention, reference being had to the appended claim.

What is claimed is:

The method for the fabrication of an electrolytic capacitor comprising the steps of successively depositing a first layer consisting essentially of a metal selected from the group consisting of aluminum, zirconium, niobium, titanium and tantalum on a substrate, said first layer having a thickness of at least 100 Angstroms, converting the said first layer entirely to the corresponding oxide, depositing a second layer consisting essentially of a film forming metal selected from the group consisting of aluminum, zirconium, niobium, titanium and tantalum, in intimate contact with said oxide layer, selectively removing portions of said second layer by photoengraving techniques thereby forming a contrasting pattern of said first and said second layers, anodizing said second layer to form an oxide dielectric film over the unexposed portions of the said first layer, and depositing a counter electrode over the said oxide dielectric film.

References Cited by the Examiner

UNITED STATES PATENTS

| | | | |
|---|---|---|---|
| 2,148,046 | 2/1939 | Burkhardt et al. | 91—70.1 |
| 2,472,304 | 6/1949 | Mason | 204—143 |
| 2,607,825 | 8/1952 | Eisler | 204—15 |
| 2,628,927 | 2/1953 | Colbert et al. | 117—217 |
| 2,719,797 | 10/1955 | Rosenblatt et al. | 117—65 |
| 2,812,297 | 11/1957 | Stareck | 204—56 |
| 2,886,502 | 5/1959 | Holland | 204—192 |
| 2,958,117 | 11/1960 | Robinson et al. | 117—217 |
| 3,035,990 | 5/1962 | Davis et al. | 204—15 |

FOREIGN PATENTS

| | | |
|---|---|---|
| 133,657 | 7/1949 | Australia. |
| 845,453 | 8/1960 | Great Britain. |

OTHER REFERENCES

Graham: Electroplating Engineering Handbook, 1955, page 442.

Jones: Inorganic Chemistry, 1947, page 668.

Partridge et al.: Glass to Metal Seals, 1949, page 63.

WINSTON A. DOUGLAS, *Primary Examiner.*

RICHARD D. NEVIUS, JOHN R. SPECK, MURRAY TILLMAN, *Examiners.*